United States Patent [19]

Wall

[11] 4,085,399
[45] Apr. 18, 1978

[54] ELECTRICAL POWER CONTROL ASSEMBLY

[75] Inventor: Bill R. Wall, Bulverde, Tex.

[73] Assignee: Power Controls Corporation, San Antonio, Tex.

[21] Appl. No.: 647,640

[22] Filed: Jan. 8, 1976

Related U.S. Application Data

[63] Continuation-in-part of Ser. No. 579,255, May 20, 1975, Pat. No. 3,990,033.

[51] Int. Cl.² ............................................. H01C 7/10
[52] U.S. Cl. .................................. 338/200; 338/172; 338/191; 338/198; 338/199
[58] Field of Search ............... 338/172, 191, 200, 198, 338/199; 200/6 C, 6 R, 6 BB, 7

[56] References Cited

U.S. PATENT DOCUMENTS

| | | | |
|---|---|---|---|
| 1,468,882 | 9/1923 | McKee et al. | 338/191 X |
| 2,956,255 | 10/1960 | Maartmann-Moe | 338/172 |

*Primary Examiner*—C. L. Albritton
*Attorney, Agent, or Firm*—Gunn & Lee

[57] ABSTRACT

A pivoted power controller in its limit positions engages a switch operating element to shunt or open a power control circuit through switch contacts mounted on a circuit board. A resistive element mounted in the same circuit board is engaged by a wiper on the controller during travel between its limit positions to vary the power supplied to a load. The resistance of the resistive element may be adjustably varied by a trimmer mounted on the circuit board adjacent one end of the resistive element.

23 Claims, 10 Drawing Figures

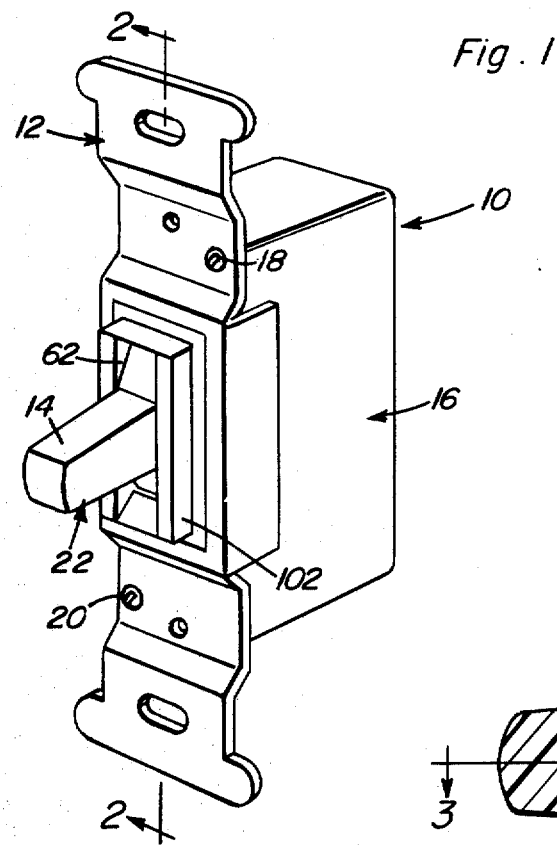
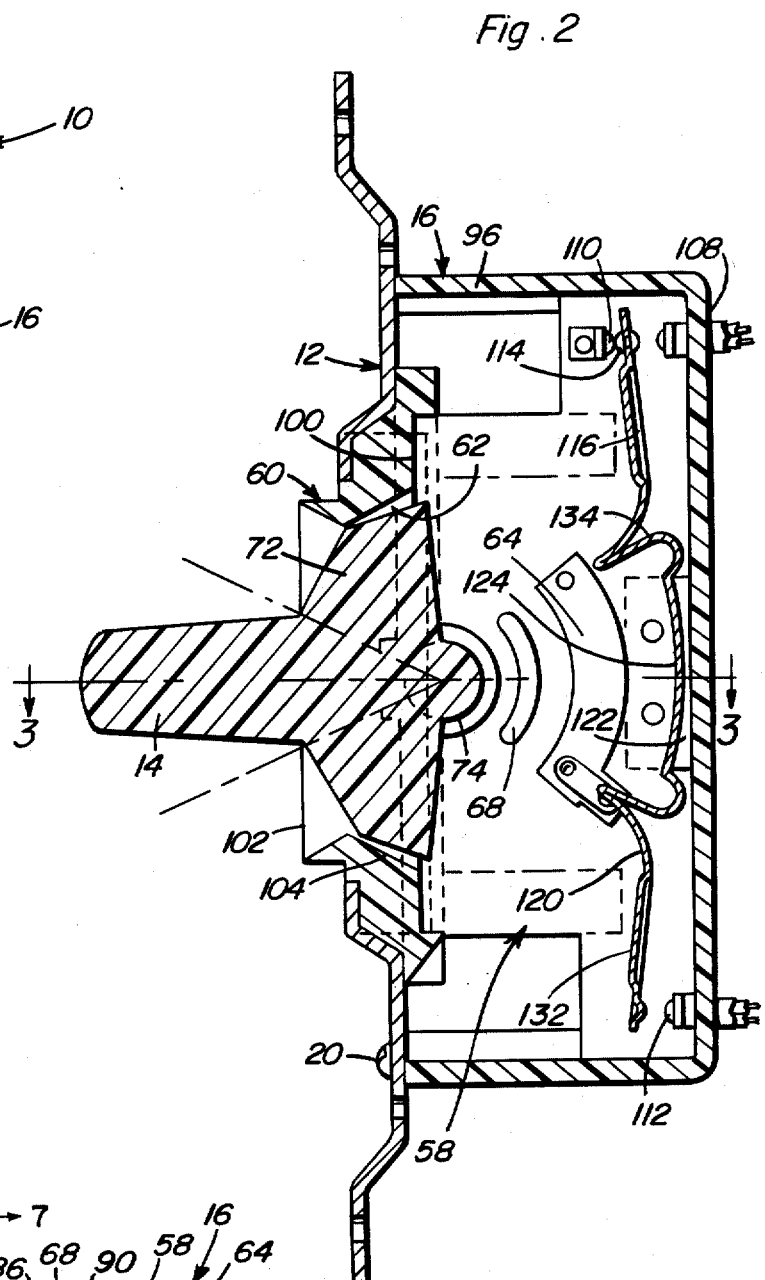
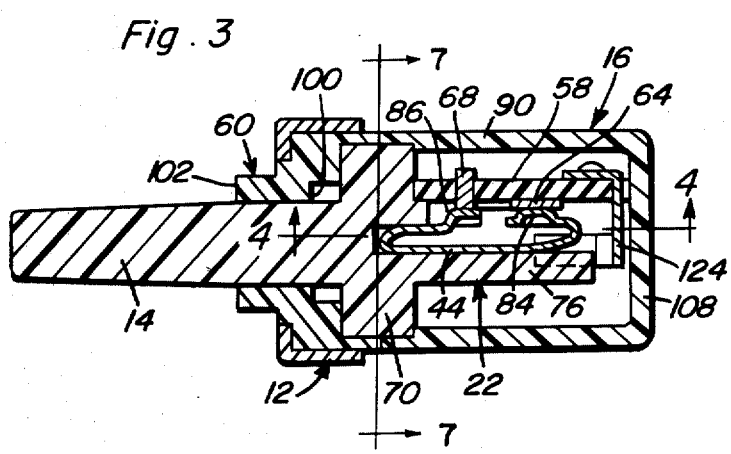

ELECTRICAL POWER CONTROL ASSEMBLY

BACKGROUND OF THE INVENTION

This invention relates to a power control device for electrical loads and embodies certain improvements over the power control device disclosed in my prior co-pending application, Ser. No. 579,225, filed May 20, 1975, now U.S. Pat. No. 3,990,033, with respect to which the present application is a continuation-in-part.

Electrical power control devices of the type referred to in my prior co-pending application are well known and generally include a potentiometer forming part of a power control circuit with switches to either shunt or open the control circuit at the limit positions of the potentiometer wiper arm. A major objective of the invention disclosed in my prior co-pending application was to adapt the foregoing type of power control device to the standard toggle switch installation usually associated with household light switches. This was accomplished by use of a single circuit board, one side of which mounts both the resistive element in wiping engagement with a bridging contact carried by the controller and the switches that are actuated by the controller when displaced to its limit positions. It is therefore an important object of the present invention to improve reliability and further reduce fabrication costs in manufacturing power control devices of the foregoing type adapted to standard size toggle switch installations.

SUMMARY OF THE INVENTION

In accordance with the present invention a switch mounting strap is secured to a standard size type of switch housing cooperating with a special closure member to internally position a circuit board and pivotally mount a manual controller having a conventional switch type of pivotal knob. A spring strip type of wiper contact engages a resistive element on one side of the circuit board which also mounts a common contact carrying element in the form of a leaf spring and circuit shunting and opening switches associated therewith. An actuator arm of the controller carries the wiper contact and deflects the common contact carrying element in its limit positions to open or close the switches. The resistance of the resistive element may be adjustably varied by a trimmer pivotally mounted on a terminal pin anchoring one end portion of the resistive element to the circuit board. The electrical components of the control circuit are carried on the same side of the circuit board with the resistive element and while the other side has the circuit conductors supported thereon.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a perspective view showing an electrical power control device constructed in accordance with the present invention.

FIG. 2 is a side section view taken substantially through a plane indicated by section line 2—2 in FIG. 1.

FIG. 3 is a transverse section view taken substantially through a plane indicated by section line 3—3 in FIG. 2.

DETAILED DESCRIPTION OF THE PREFERRED EMBODIMENT

Figure 4:
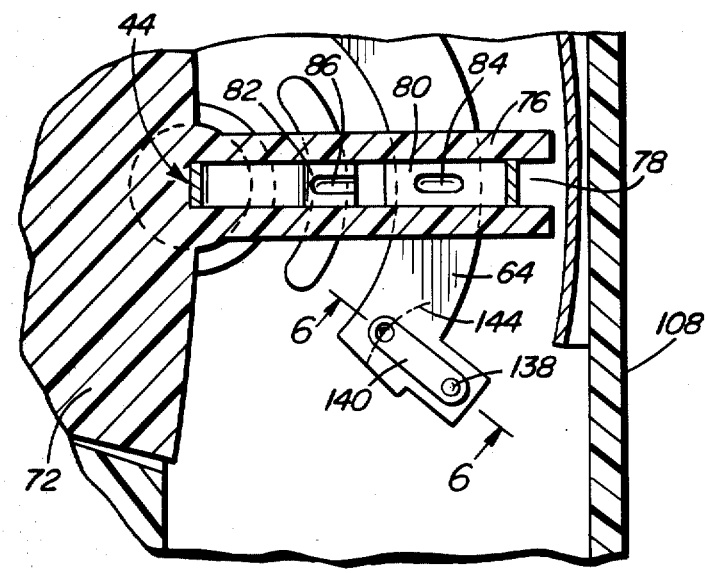
FIG. 4 is an enlarged partial section view taken substantially through a plane indicated by section line 4—4 in FIG. 3.

Referring now to the drawings in detail, FIG. 1 illustrates a power control device 10 having an external appearance and size corresponding to a conventional and standard household light switch assembly. The power control device is therefore adapted to be installed wherever such light switch assemblies are mounted and includes a vertically elongated, metal mounting strap 12 from which the usual type of pivotal or toggle switch knob 14 projects and a housing 16 made of an electrically non-conductive material secured to the mounting strap by screws 18 and 20.

The knob 14 forms part of a manual controller generally referred to by reference numeral 22 by means of which the supply of electrical energy to an electrical load is controlled. As diagrammatically shown in FIG. 10, the controller 22 is operative through a control circuit 24 to vary the power applied to a load such as lamp 26 from the usual AC power source 28. The control circuit 24 itself is well known and includes, for example, a triac 30 connected in series with inductor 32 and the load 26 across the voltage supply lines 34 and 36. This series circuit is broken by opening of a normally closed switch 38 actuated by the controller at one limit position thereof. In the other limit position of the controller, normally open switch 40 is actuated to shunt or by-pass the control circuit 24 by connecting the load 26 directly across the voltage supply lines 34 and 36 in parallel with capacitor 42 of the control circuit. During travel between its open and closed limit positions, the controller also displaces the wiper 44 of a variable resistor generally referred to by reference numeral 46 through which current is supplied to the control electrode of triac 30 regulated by a RC network including the series connected resistor 48 and parallel connected capacitors 50 and 52. An adjustable trimmer resistor 54 is connected in parallel with the variable resistor 46 to compensate for changes in terminal resistance at terminal 56 of the variable resistor 46. The components and conductors of the foregoing control circuit as well as the switches 38 and 40 are enclosed within the housing 16. The controller 22 will accordingly gradually vary the power supplied to a load as it is displaced between open and closed positions for dimming and/or for energy conservation purposes.

As more clearly seen in FIGS. 2, 3, 7 and 8, the control circuit components are mounted on a circuit board 58 which is held in position within the housing 16 by means of a closure member 60 that is inserted into an open longitudinal side of the housing. The inserted closure member 60 is held assembled in the housing 60 by means of the mounting strap 16 that is placed thereover and then secured to the housing by means of the screws 18 and 20 as aforementioned. The controller 22 projects through a central opening 62 formed in the closure member 60 and is pivotally supported for displacement between limits as will be explained in detail hereafter. The wiper contact element 44 carried by the controller 22, as more clearly seen in FIG. 3, forms part of the variable resistor 46 and wipingly engages a resistive element 64 that is mounted on one planar side surface 66 of the circuit board. The resistive element 64 extends along the track path of the wiper element 44 for continuous contact therewith during travel of the controller between its limit positions. A continuous current collector or jumper 68 is also mounted on the circuit board and exposed on the side surface 66 in parallel spaced relation to the resistive element 64 for wiping contact with the wiper element 44. The conductive element 68 establishes the electrical connection between the wiper element 44 and the control circuit 24 as diagrammed in FIG. 10.

Figure 8:
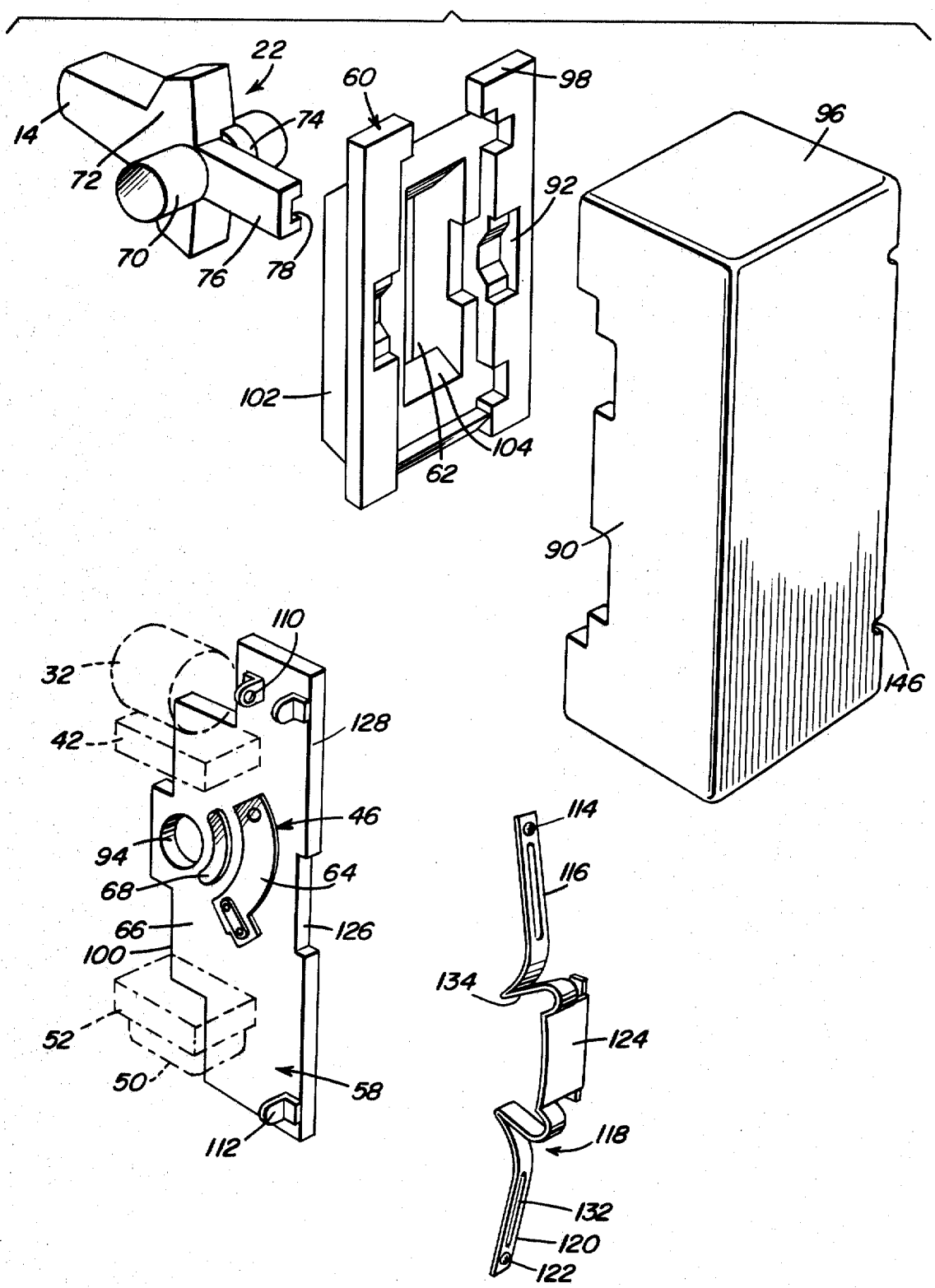
FIG. 8 is a perspective view showing disassembled parts of the power control device.

As more clearly seen in FIG. 8, the manual controller 22 includes an intermediate shaft portion 70 from which a pair of wing portions 72 extend transversely of the lever knob 14. The shaft portion 70 extends axially from a semicylindrical hub portion 74 of the same thickness as the wing portion 72 along the axis of the shaft portion 70. An actuator arm 76 of approximately half the thickness of the wing portions 72 extends radially from the hub portion 74 in alignment with the knob 14. One side of the actuator arm 76 confronting the circuit board 58 is provided with a slot 78 within which the wiper contact element 44 is carried as more clearly seen in FIGS. 3 and 4. The wiper contact element 44 is made of a single strip of spring material formed into a split loop having adjacent end portions 80 and 82 provided with contact formations 84 and 86, respectively, engaging the resistive element 64 and conductive element 68.

The manual controller 22 is pivotally mounted by means of its shaft portion 70 within pivotal guide cavities formed by the assembled housing 16 and closure member 60. Pivotal guide recesses 88 are accordingly formed in the side walls 90 of the housing cooperating with the member 60 to form the guide cavities, as more clearly seen in FIGS. 7 and 8. The shaft portion also accurately positions the circuit board 58 by extending through an opening 94 formed therein for this purpose. The circuit board 58 when positioned within the housing extends longitudinally between the end walls 96 thereof beyond the longitudinal ends 98 of the closure member 60, as more clearly seen in FIG. 7.

The closure member 60 is held in abutment with the front edge 100 of the circuit board by means of the mounting strap 12 provided with an opening through which a projecting portion 102 of the closure member extends, as more clearly seen in FIG. 2. The central opening 62 is formed at opposite longitudinal ends by bevelled surfaces 104 adapted to be engaged by the winged portions 72 of the controller when displaced to its limit position, as shown in FIG. 5.

Figure 5:
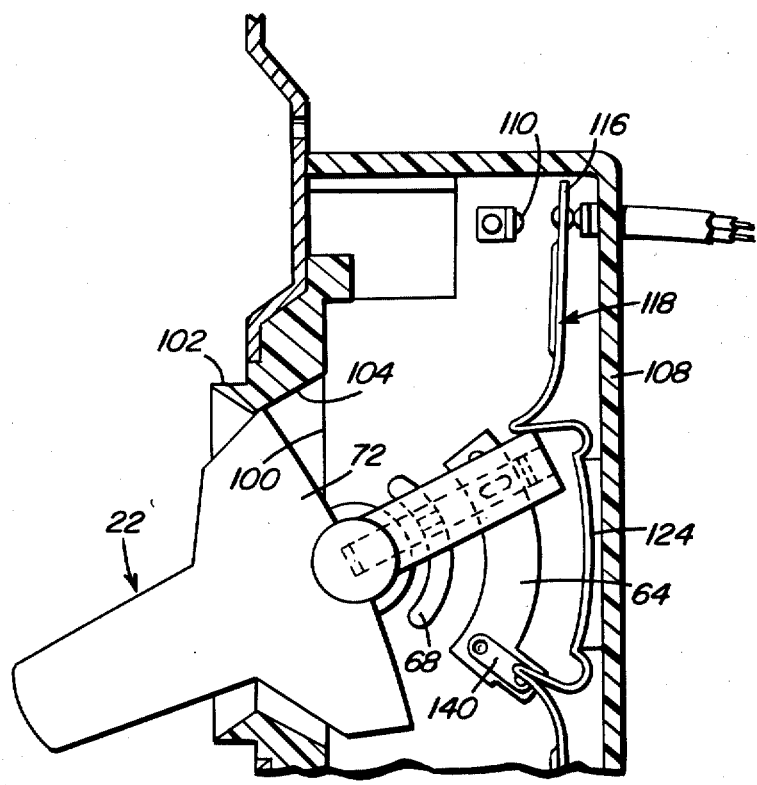
FIG. 5 is a partial side section view showing the controller in one of its limit positions.

Referring now to FIGS. 2 and 5, in particular, the planar surface 66 of the circuit board on which the resistive element 64 is exposed, also mounts adjacent the end walls 96 and back wall 108 of the housing, fixed switch contacts 110 and 112. The switch contact 110 is normally engaged by a movable contact 114 carried on one of the arms 116 of a common switch operating member 118, the other arm 120 carrying another movable contact 122 normally spaced from fixed switch contact 112, as shown in FIG. 2. The common switch operating member 118 is made of a single strip of spring material having an intermediate anchor portion 124 that extends through a slot 126 formed in the rear edge 128 of the circuit board abutting the rear wall 108 of the housing. The anchor portion 124 of the common switch operating member is secured to the circuit board by fasteners 130 on the side opposite side 66, as more clearly seen in FIGS. 3 and 9. The arms 116 and 120 are stiffened by ribs 142 formed thereon and are interconnected with the intermediate anchor portion by means of curved deflection portions 134. The deflection portions project into the path of movement of the actuator arm 76 of the controller. Thus, when the controller is displaced to either of its limit positions, as shown in FIG. 5, the actuator arm engages one of the deflection portions 134 in order to cause deflection of one of the contact carrying arm 116 and 120. The normally closed or normally opened switch is thereby actuated in order to either open the control circuit or by-pass the control circuit. When engaged with one of the deflection portions 134, the actuator arm 76 of the controller will have moved the wiper contact element 44 to one end or the other of the resistive element 64.

Figure 6:
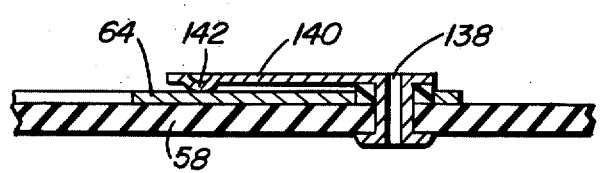
FIG. 6 is a partial section view taken substantially through a plane indicated by section line 6—6 in FIG. 4.

Referring now to FIGS. 4 and 6, the resistive element 64 constituting a linear or tapered resistance is anchored to the circuit board on the side 66 adjacent its end portions by means of tabs 136 that extend laterally from the track path of the resistive element. One of the anchor tabs is secured to the circuit board by means of a terminal pin 138 and is coated with appropriate material to form a fixed resistance region at the end portion of the resistive element. The trimmer 54 extends from the resistive termination point at the pin 138 and includes an electrically conductive contact arm 140 that is pivotally displaceable with the terminal pin 138 in the illustrated embodiment. A contact formation 142 is formed at the end of the contact arm 140 opposite the terminal pin 138 for movement along an arcuate path 144 on the coated surface of the resistive element 64 within the fixed resistance region. Thus, the angular position of the trimmer contact arm 140 will determine the resistance between the end portion of the resistive element 64 and the zero resistance termination point. In this manner, the total effective resistance of the resistive element may be adjusted or trimmed in order to compensate for manufacturing deviations, wear and to meet different requirements for the present invention or for potentiometers in general.

Figure 7:
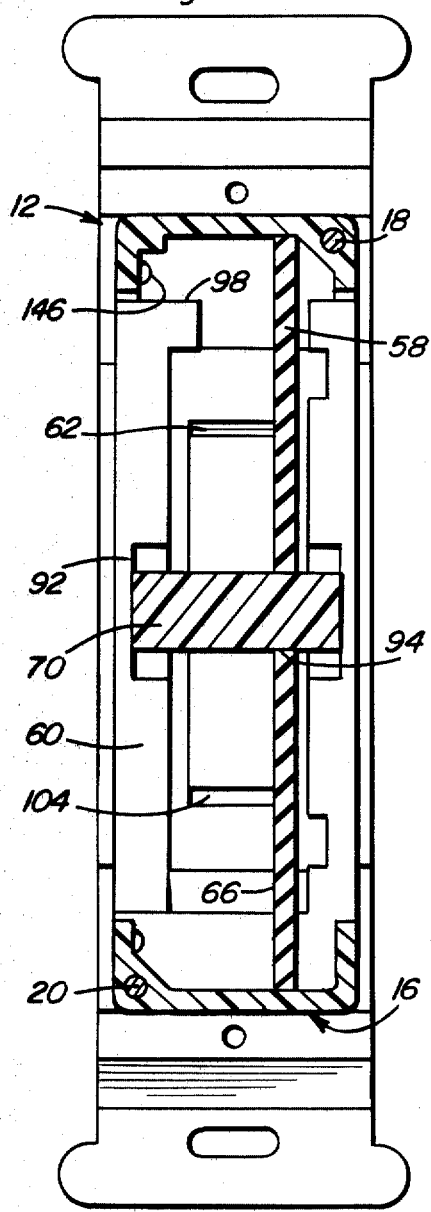
FIG. 7 is an enlarged section view taken substantially through a plane indicated by section line 7—7 in FIG. 3.
Figure 9:
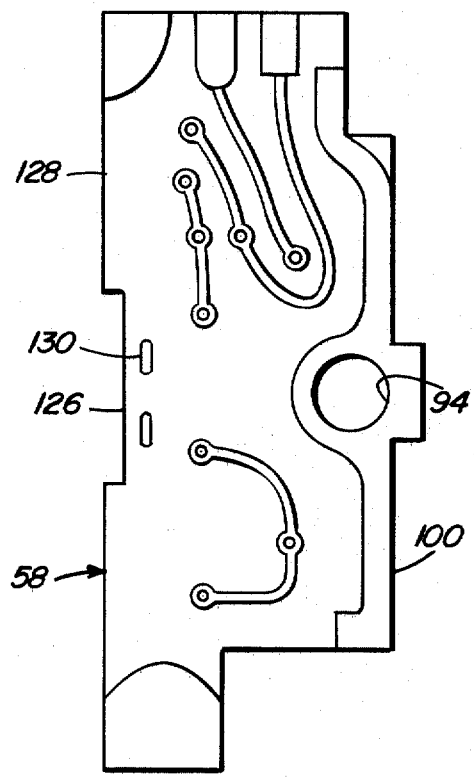
FIG. 9 is a plan view of one side of the circuit board associated with the power control device.

As shown by dotted line in FIG. 8, the control circuit components are mounted on the side 66 of the circuit board. The conductors of the control circuit are mounted on the other side of the circuit board, as shown in FIG. 9. Electrical wiring connected to the circuit and extending externally of the control device may extend through openings 146 formed at the intersection of the rear wall 108 and one of the side walls 90 of the housing as shown in FIG. 8. The screws 18 and 20 securing the mounting strap 12 to the housing are received within taped bores formed in diagonally opposite formations at the corners between the end walls 96 and the side walls, as shown in FIG. 7.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed as new is as follows:

1. In an electric power control device having a control circuit which includes a resistive element and a pair of switch contacts for respectively shunting and opening the control circuit, the improvement comprising an electrically non-conductive housing, a circuit board positioned within the housing on which said control circuit is mounted, means mounting the resistive element for exposure on one side of said circuit board along a track path, a common switch operating member mounted on the circuit board and carrying said pair of switch contacts in spaced relation to each other, a manual controller, means pivotally mounting the manual controller for displacement between limit positions in which the common operating member is engaged to alternately shunt and open the control circuit, and wiper means mounted on the controller for contact with said resistive element along the track path during displacement of the controller between said limit positions to vary the power supplied to a load.

2. The combination of claim 1 wherein said common switch operating member comprises a leaf spring element having an intermediate portion anchored to the circuit board, a pair of contact-carrying arms, deflection portions interconnecting the arms with said intermediate portion, said deflection portions being engageable by said manual controller in the limit positions thereof.

3. The combination of claim 2 wherein said pivotal mounting means comprises a closure member insertable into the housing in enclosing relation to the circuit board, said closure member having an opening through which the controller projects externally of the housing and aligned recesses cooperating with the housing to form pivotal guide cavities for the controller.

4. The combination of claim 3 including a mounting strap secured to the housing in abutment with the closure member holding the same assembled with the housing.

5. The combination of claim 4 wherein said manual controller includes a pivot shaft portion received within said pivotal guide cavities, an actuator arm projecting from the pivot shaft portion in close parallel spaced relation to the circuit board, a pair of wing portions projecting from the shaft portion transversely of the actuator arm within the opening in the closure member and engageable therewith to limit arcuate movement of the actuator arm, and a knob portion projecting from the wing portions in general alignment with the actuator arm externally of the housing.

6. The combination of claim 5 wherein said wiper means comprises an electrically conductive spring strip received within a slot formed in the actuator arm in confronting relation to said one side of the circuit board, said strip being formed into a split loop having adjacent end portions, one of said end portions being in wiping contact with the resistive element.

7. The combination of claim 6 wherein said means mounting the resistive element includes an anchor tab projecting from an end portion of the resistive element laterally of said track path and a terminal pin connecting the tab to the circuit board.

8. The combination of claim 7 including trimmer means mounted on the terminal pin for varying the effective resistance of said resistive element between the end portion thereof and the terminal pin.

9. The combination of claim 8 wherein said trimmer means includes an electrically conductive trimmer element pivotally mounted by the terminal pin on the circuit board and a contact formation projecting from the trimmer element into engagement with the resistive element.

10. The combination of claim 1 wherein said pivotal mounting means comprises a closure member insertable into the housing in enclosing relation to the circuit board, said closure member having an opening through which the controller projects externally of the housing and aligned recesses cooperating with the housing for form pivotal guide cavities for the controller.

11. The combination of claim 10 wherein said manual controller includes a pivot shaft portion received within said pivotal guide cavities, an actuator arm projecting from the pivot shaft portion in close parallel spaced relation to the circuit board, a pair of wing portions projecting from the shaft portion transversely of the actuator arm within the opening in the closure member and engageable therewith to limit arcuate movement of the actuator arm, and a knob portion projecting from the wing portions in general alignment with the actuator arm externally of the housing.

12. The combination of claim 11 wherein said wiper means comprises an electrically conductive spring strip received within a slot formed in the actuator arm in confronting relation to said one side of the circuit board, said strip being formed into a split loop having adjacent end portions, one of said end portions being in wiping contact with the resistive element.

13. The combination of claim 1 wherein said manual controller includes a pivot shaft portion, an actuator arm projecting from the pivot shaft portion in close parallel spaced relation to the circuit board, a pair of wing portions projecting from the shaft portion transversely of the actuator arm to limit arcuate movement of the actuator arm, and a knob portion projecting from the wing portions in general alignment with the actuator arm externally of the housing.

14. The combination of claim 13 wherein said common switch operating member comprises a leaf spring element having an intermediate portion anchored to the circuit board, a pair of contact-carrying arms, deflection portions interconnecting the arms with said intermediate portion, said deflection portions being engageable by said actuator arm in the limit positions thereof.

15. The combination of claim 13 wherein said wiper means comprises an electrically conductive spring strip received within a slot formed in the actuator arm in confronting relation to said one side of the circuit board, said strip being formed into a split loop having adjacent end portions, one of said end portions being in wiping contact with the resistive element.

16. The combination of claim 1 wherein said means mounting the resistive element includes an anchor tab projecting from an end portion of the resistive element laterally of said track path and a terminal pin connecting the tab to the circuit board.

17. The combination of claim 16 including trimmer means mounted by the terminal pin on the circuit board for varying the effective resistance of said resistive element between the end portion thereof and the terminal pin.

18. The combination of claim 17 wherein said trimmer means includes an electrically conductive trimmer element pivotally mounted by the terminal pin and a contact formation projecting from the trimmer element into engagement with the resistive element.

19. The combination of claim 1 including impedance means mounted on the circuit board for varying the effective resistance.

20. In an electric power control device having a control circuit which includes a resistive element, a housing, a circuit board positioned within the housing on which said control circuit is mounted, means mounting the resistive element for exposure on one side of said circuit board along a track path, a manual controller, wiper means mounted on the controller for contact with said resistive element along the track path during displacement of the controller between limit positions to vary the power supplied to a load and impedance means mounted on the circuit board for varying the effective resistance.

21. The combination of claim 20 wherein said means mounting the resistive element includes an anchor tab projecting from an end portion of the resistive element laterally of said track path and a terminal pin connecting the tab to the circuit board.

22. The combination of claim 21 wherein said impedance means includes a trimmer means having an electrically conductive trimmer element pivotally mounted by the terminal pin on the circuit board and a contact formation projecting from the trimmer element into engagement with the resistive element.

23. In combination with a potentiometer having a resistive element mounted on a supporting surface to form a resistance track path, adjustable trimmer means connected to an end portion of said resistive element, comprising termination means connected to the end portion of the resistive element to form a region of fixed resistance, extending from a termination point of zero resistance, a conductive wiper arm movably mounted for displacement relative to said termination point, and contact means carried by said wiper arm for engagement with the end portion of the resistive element within said region of fixed resistance along a trimmer adjustment track to adjust the resistance of said track path of the potentiometer.

* * * * *

UNITED STATES PATENT AND TRADEMARK OFFICE
CERTIFICATE OF CORRECTION

PATENT NO. :  4,085,399
DATED      :  April 18, 1978
INVENTOR(S) : Bill R. Wall

Figure 10:
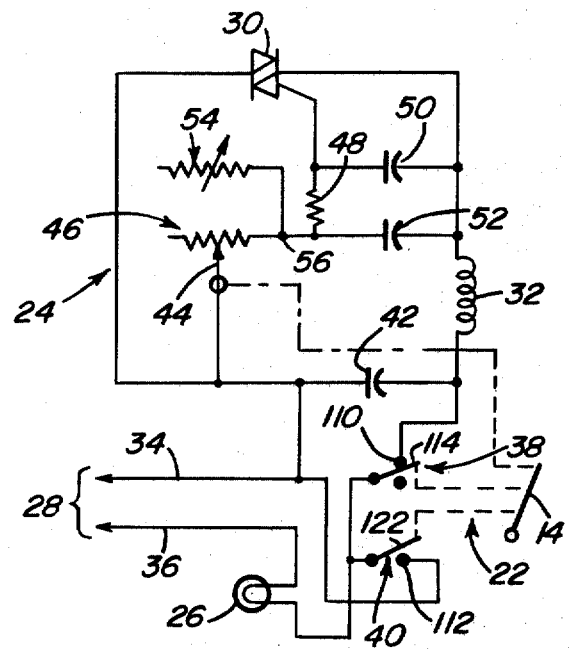
FIG. 10 is a circuit diagram corresponding to the control circuit associated with the power control device.

It is certified that error appears in the above-identified patent and that said Letters Patent is hereby corrected as shown below:

Fig. 10 should appear as shown on the attached sheet.

Signed and Sealed this

*Eighth* Day of *October 1985*

[SEAL]

*Attest:*

*Attesting Officer*

DONALD J. QUIGG

*Commissioner of Patents and Trademarks—Designate*

UNITED STATES PATENT AND TRADEMARK OFFICE
CERTIFICATE OF CORRECTION

PATENT NO. : 4,085,399
DATED : April 18, 1978
INVENTOR(S) : Bill R. Wall

It is certified that error appears in the above-identified patent and that said Letters Patent are hereby corrected as shown below:

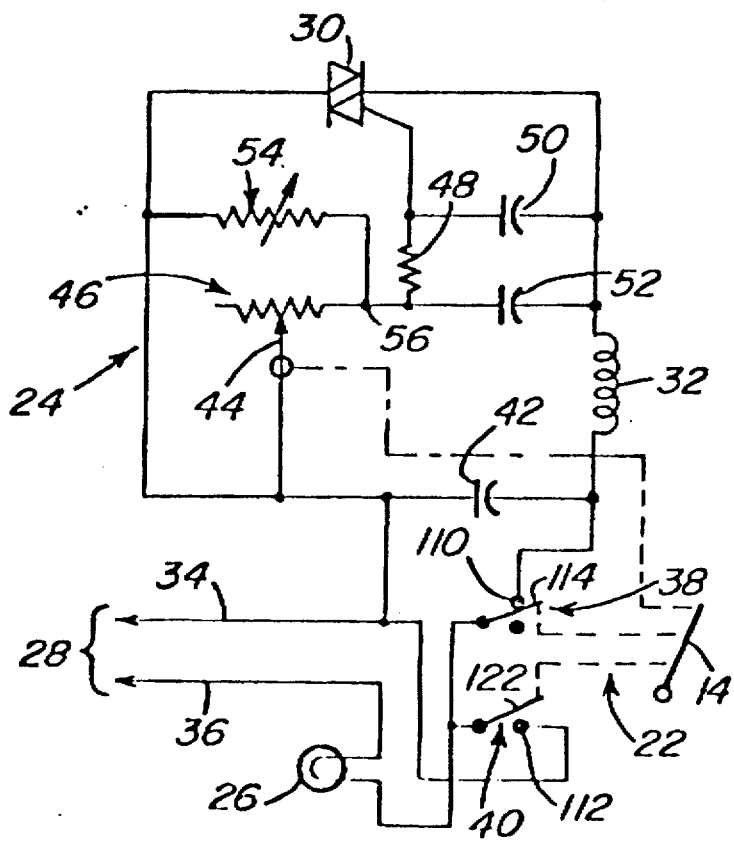

Fig. 10